United States Patent [19]

Hare

[11] Patent Number: 5,236,801
[45] Date of Patent: *Aug. 17, 1993

[54] IMAGING TRANSFER SYSTEM AND PROCESS FOR TRANSFERRING IMAGE AND NON-IMAGE AREAS THEREOF TO A RECEPTOR ELEMENT

[75] Inventor: Donald Hare, East Brunswick, N.J.

[73] Assignee: Foto-Wear, Inc., Milford, Pa.

[*] Notice: The portion of the term of this patent subsequent to Aug. 18, 2009 has been disclaimed.

[21] Appl. No.: 864,551

[22] Filed: Apr. 7, 1992

Related U.S. Application Data

[62] Division of Ser. No. 505,027, Apr. 5, 1990, Pat. No. 5,139,917.

[51] Int. Cl.⁵ .............................................. G03C 5/54
[52] U.S. Cl. ............................... 430/199; 430/138; 430/200; 430/203; 430/254
[58] Field of Search ............... 430/138, 199, 200, 203, 430/224, 254

[56] References Cited

U.S. PATENT DOCUMENTS

| | | | |
|---|---|---|---|
| 2,528,395 | 12/1946 | Slifkin | 430/180 |
| 3,219,446 | 11/1965 | Berman et al. | 430/138 |
| 4,234,673 | 11/1980 | Scrutton et al. | 430/252 |
| 4,399,209 | 8/1983 | Sanders et al. | 430/138 |
| 4,416,966 | 11/1983 | Sanders et al. | 430/138 |
| 4,440,846 | 4/1984 | Sanders et al. | 430/138 |
| 4,536,463 | 8/1985 | Sanders | 430/138 |
| 4,551,407 | 11/1985 | Sanders et al. | 430/138 |
| 4,622,282 | 11/1986 | Head et al. | 430/138 |
| 4,675,269 | 6/1987 | Saccocio et al. | 430/138 |
| 4,701,397 | 10/1987 | Rourke et al. | 430/254 |
| 4,751,165 | 6/1988 | Rourke et al. | 430/138 |
| 4,756,988 | 7/1988 | Kausch et al. | 430/271 |
| 4,788,125 | 11/1988 | Davis et al. | 430/138 |
| 4,816,367 | 3/1989 | Sakojiri et al. | 430/138 |
| 4,822,714 | 4/1989 | Sanders | 430/138 |
| 4,842,976 | 6/1989 | Sanders et al. | 430/138 |
| 4,842,981 | 6/1989 | Sanders et al. | 430/138 |
| 4,865,938 | 9/1989 | Sakai et al. | 430/138 |
| 4,880,678 | 11/1989 | Goffi | 428/40 |
| 5,019,475 | 5/1991 | Higashiyama et al. | 430/254 |
| 5,139,917 | 8/1992 | Hare | 430/138 |

FOREIGN PATENT DOCUMENTS 62-027735 5/1987 Japan.
1546753 3/1988 United Kingdom.

Primary Examiner—Hoa Van Le
Attorney, Agent, or Firm—Birch, Stewart, Kolasch & Birch

[57] ABSTRACT

The present invention is directed to an imaging system wherein the developed image and non-image areas are transferred to a receptor element by a transfer coating layer. The transfer layer of the present invention is coated on the support of the imaging sheet and/or developer sheet and comprises a material capable of holding developed images and non-image areas that can be transferred to a receptor surface upon the application of heat to the rear surface of the support. The transfer coating layer is capable of liquefying when heated and resolidifying when heat is removed.

The present invention is further directed to a method of applying an image to a receptor element which comprises the steps of exposing an imaging system based on photosensitive encapsulates, developing the exposed element to form an image, positioning the front surface of the developed element containing the transfer layer of the invention against the receptor element, and applying heat to the rear surface of the element to transfer the developed image and non-image area to the receptor element.

5 Claims, 1 Drawing Sheet

IMAGING TRANSFER SYSTEM AND PROCESS FOR TRANSFERRING IMAGE AND NON-IMAGE AREAS THEREOF TO A RECEPTOR ELEMENT

This application is a divisional of copending application Ser. No. 07/505,027, filed on Apr. 5, 1960, now U.S. Pat. No. 5,139,917, the entire contents of which are hereby incorporated by reference.

BACKGROUND OF THE INVENTION

1. Field of the Invention

The present invention relates to a transfer element, preferably using CYCOLOR technology, and to a method of transferring developed image areas and non-image areas to a receptor element.

2. Description of the Prior Art

CYCOLOR is a registered trademark of Mead Imaging, a Division of Mead Corporation, Dayton, Ohio. CYCOLOR technology provides full color imaging generally associated with photography. With CYCOLOR technology, for example, a polyester base may be coated with light-sensitive microcapsules called cyliths, which are sensitive to red, green and blue light. Each cylith resembles a water-filled balloon and is about one-tenth the diameter of a human hair. The cyliths contain a liquid monomer in which is dissolved a light sensitive photoinitiator and a color forming substance called a leuco dye.

The support (e.g., polyester) is exposed to light transmitted through or reflected from an original color image. The resulting latent image resembles the negative used in conventional photography. Exposure to light hardens the cyliths in proportion to the amount of exposure, rendering them resistant to physical rupture. Thus, the latent image is a pattern of hard (exposed) and soft (unexposed) cyliths.

The final image is developed by bringing the cyliths into contact with a sheet of CYCOLOR paper or transparency. Full color is obtained by mixing three different types of cyliths and coating them on a support (e.g., polyester). Each of the three types of cyliths contain either a cyan, magenta or yellow leuco dye, along with photoinitiators that are sensitive respectively to red, green or blue light. Exposure to red light hardens the capsules containing the cyan dye. Pressure development results in the release of magenta and yellow dyes which mix to form a red image. Exposure to green light controls the magenta dye. Pressure development results in the cyan and yellow dyes mixing to form a green image. Blue light controls the yellow dye. Pressure development results in the mixing of the cyan and magenta dyes to form a blue image. Exposure of all cyliths (white light) results in non color (white or non-image area) and exposure of none of the cyliths results in black. Any color can be reproduced by controlling the relative proportion of the three dyes.

Applications of CYCOLOR technology include use in color copiers to make color copies, or this technology may be used to create hard copy prints from 35 mm slides. Other applications include use with color computer printers to provide prints from computer systems. CYCOLOR technology also works with digital imaging techniques by providing hard copies of images produced by electronic cameras.

However, the developed image and non-image areas cannot be simultaneously transferred to a receptor surface (e.g. textile) with conventional CYCOLOR technology.

U.S. Pat. No. 4,751,165 discloses an imaging system which provides an imaging sheet and a layer of microcapsules containing a photosensitive composition and a color former. However, the developed image and non-image areas thereof are not capable of being simultaneously transferred to a receptor element.

Accordingly, imaging systems based on photosensitive encapsulates are known. U.S. Pat. No. 3,219,446 by Berman discloses the selected transfer of dye to a copy sheet. U.S. Pat. No. 3,700,439 by Phillips discloses a photocopy process involving development of capsules without transfer.

Thus, while image forming techniques are known, none of these techniques provide for the transfer of the simultaneous image and non-image area to a receptor element with the transfer coating layer described hereinbelow.

SUMMARY OF THE INVENTION

Thus, a principal object of the present invention is to provide an imaging system wherein the developed image and non-image areas are transferred to a receptor element by the use of a transfer coating layer. The transfer layer of the present invention is coated on the support of an imaging sheet and/or developer sheet and comprises a material capable of holding developed images and non-image areas that can be transferred to a receptor surface upon the application of heat to the rear surface of the support. The transfer coating layer is capable of liquefying when heated and resolidifying when heat is removed. More specifically, upon heating, the transfer coating layer liquefies and releases from the support in liquid or semi-liquid form and then embeds within and around fibers of the receiving element (e.g., textile fabric). Thus, the image and non-image areas are transferred to the receptor element during the process of liquefaction as a result of heating. When cooled, the liquid coating solidifies thereby sealing the transferred image and non-image areas to the receptor element and rendering the transferred image washproof or wash resistant.

The present invention is further directed to a method of applying image and non-image areas to a receptor element which comprises the steps of exposing an imaging system based on photosensitive encapsulates, developing the exposed element to form an image, positioning the front surface of the developed element containing the transfer layer of the invention against the receptor element, and applying heat to the rear surface of the developed element to transfer the developed image and non-image area to the receptor element.

BRIEF DESCRIPTION OF THE DRAWINGS

The present invention will become more fully understood from the detailed description given hereinbelow, and the accompanying drawings which are given by way of illustration only, and thus are not limitative of the present invention, and wherein;

FIG. 2 illustrates the step of ironing the imaging sheet onto a tee shirt or the like.

DETAILED DESCRIPTION OF THE INVENTION

Figure 1:
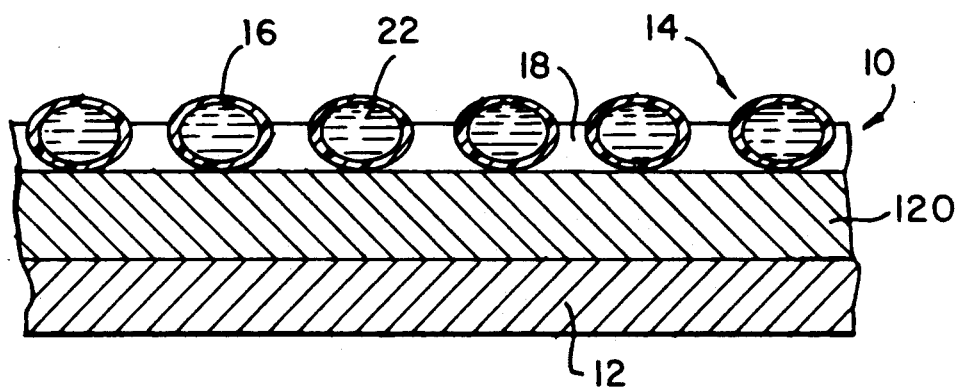
FIG. 1 is a cross-sectional view of the preferred embodiment of an imaging sheet of the present invention.

The term "encapsulated" refers to both so-called resin dispersion or open phase systems in which the internal phase containing a chromogenic material is dispersed as droplets throughout a dispersing medium and systems in which the capsule is formed with a discrete capsular wall, the latter encapsulation typically being in the form of microcapsule. The term "microcapsule" includes both microcapsules having discrete walls and microcapsules within a so-called open phase system comprising a dispersion of the internal phase constituents in a binder. "Pressure rupturable capsules" are, accordingly, considered to exist in either of these "encapsulated" systems. Furthermore, while the capsules are described herein as "pressure rupturable" means other than pressure may be used to rupture them (e.g. heat).

The term "actinic radiation" includes the entire electromagnetic spectrum including ultraviolet (U.V.) and infrared (I.R.) radiation.

The photosensitive microcapsules used in the present invention can be prepared as described in U.S. Pat. Nos. 4,751,165, 4,399,209, 4,440,846 and 4,482,624.

Typically, CYCOLOR copiers/printers utilize a paper containing a vast number of colored microcapsules which, when exposed to varying degrees of energy (e.g. heat, light or pressure) form a color image. In the present invention a transfer carrier such as Damar, TRANSEEZE or a combination thereof is inserted between the color producing surface coating and the base layer. As a result of the invention, the transfer coating will release under energy (e.g heat) and carry the image and non-image areas to the receptor (e.g. textile) in washproof color.

Furthermore, in a further representative use of CYCOLOR technology two sheets of paper are required. A color encapsulated "donor" roll marries a second paper at the point of light/heat. The images or image precursors of the donor paper transfer onto a receptor sheet treated with a known special resin surface. In the present invention, a transfer coating such as Damar, TRANSEEZE or a combination thereof is inserted between the paper and a resin surface second sheet. This second sheet contains a particular resin coating to receive the color or color precursor from the donor paper.

Accordingly, the invention is directed to a donor sheet comprising a support and a top coating containing image (e.g. color) forming microcapsules with an optional transfer coating therebetween, wherein the "latent" image is transferred to a receptor sheet comprising a support, the transfer coating of the invention, and a developer containing layer. As a result of the invention, the developed image and non-image areas may then be transferred to a receptor element (e.g. textile).

Therefore, in a single self-contained imaging sheet comprising a support, the transfer layer of the invention, and a top coating of image forming microcapsules plus developer, the image and non-image areas may be directly transferred to a receptor element (e.g. textile). In a two sheet system, the sheet ultimately containing the developed image should have the transfer coating of the invention so that the image and non-image areas may be directly transferred to the receptor element.

A representative imaging sheet of the invention is based on the imaging sheet of U.S. Pat. No. 4,751,165 except that it incorporates the transfer layer of the present invention. This imaging sheet is set forth in FIG. 1 and is generally represented by reference numeral 10. The imaging sheet 10 includes a support 12 having a transfer coating layer 120 and a photosensitive layer 14 on one surface thereof. The layer 14 includes photosensitive microcapsules 16 and a developer resin (e.g., phenolic) 18. The microcapsules 16 and developer resin 18 do not need to be coated in the same layer, but can be coated in contiguous layers with the microcapsules underlying or overlying a layer of the developer resin. The support 12 may be a polymeric film. If the support 12 is transparent, the imaging sheet can be exposed from either surface. The developer layer 18 is not necessarily a film but may consist of finely divided dispersion particles. Similarly, developer layer 18 is not necessarily contiguous but may be interrupted by pores or capillaries.

Figure 2:
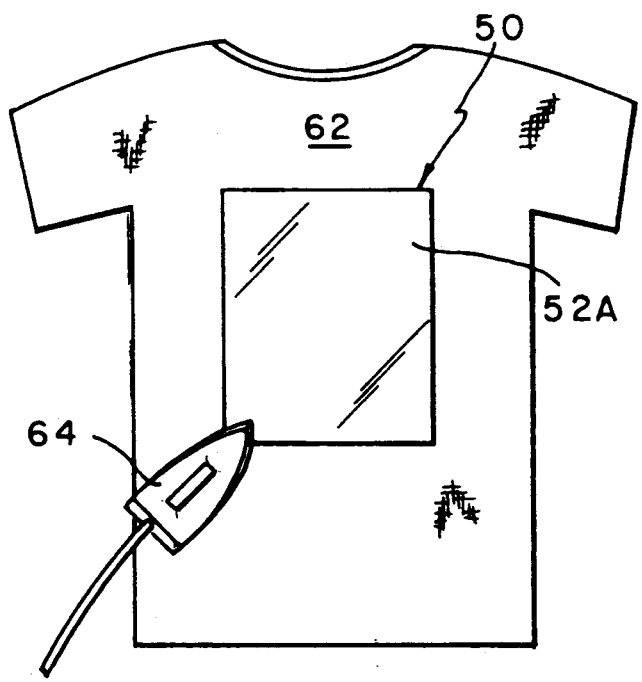

Techniques for exposing and developing the above-described imaging sheet 10 are known in the art (see FIG. 2 of U.S. Pat. No. 4,751,165).

The mechanism whereby the microcapsules rupture and release the internal phase is explained in more detail in U.S. Pat. Nos. 4,751,165 and 4,399,209. Exposure alone or in conjunction with heating effects a change in the viscosity of the internal phase such that the internal phase is differentially released from the microcapsules in the exposed and unexposed areas upon subsequent application of rupture and transfer force.

After exposure, the imaging sheet 10 is developed alone or is assembled with the receptor element prior to development. The imaging sheet is developed by applying a rupturing force such as with pressure rollers.

The imaging sheet/receptor element assembly is heated to melt the transfer coating so that the image and non-image areas are transferred to the receptor element.

The color former reacts with the developer to produce a visible dye image. The entire image and non-image area is transferred to the receptor element. This is contrary to the teachings of U.S. Pat. No. 4,751,165, wherein the image areas selectively adhere to the paper while the non-image areas remain attached to the support.

Full color imaging systems are described in more detail in U.S. Pat. No. 4,842,976.

Representative developer containing resins include phenolic developer resins, as described in U.S. Pat. No. 4,751,165.

The developer-containing resin and microcapsule composition can be coated using conventional coating techniques such as blade coating, roll coating, etc.

The photosensitive composition may comprise photohardenable or photosoftenable compositions. Examples of both are provided in U.S. Pat. No. 4,399,209.

In one embodiment of the invention full color images are formed. In this embodiment, the photosensitive layer 14 contains a mixture of microcapsules having distinct wavelength sensitivities and containing cyan, magenta, yellow and optionally black color formers. See U.S. Pat. Nos. 4,751,165 and 4,842,976. The microcapsules are mixed and coated with a developer-containing resin as described above. If the microcapsules are respectively sensitive to red, green, and blue light, the imaging sheet can be exposed by direct transmission or reflection imaging. In most cases, however, the microcapsules have distinct sensitivities in the ultraviolet spectrum. In this case, color separation or image processing is required to expose the imaging sheet. Using color separations, the imaging sheet is exposed to three distinct bands of ultraviolet radiation through the color separation in order to control the release and transfer of the cyan, magenta, and yellow color formers. Alternatively, a color image is resolved into its red, green, blue, and optionally black components each of which is then respectively electronically translated into radiation to which the photosensitive composition associated with the complimentary color former is sensitive. The exposure device will control three or four distinct bands of radiation which may be emitted from a single radiation source or a plurality of sources. For example, a Dunn or matrix camera may be used to produce electronic signals corresponding to the cyan, magenta, and yellow (and optionally black) images that are desired. This output drives the electronic control means for an exposure device which may include a conventional multiplexer logic package and timing means. The exposure device selectively drives a radiation source to which the microcapsules on the imaging sheet are sensitive and thereby image-wise exposes the imaging sheet. Various imaging apparatuses are described in U.S. Pat. No. 4,751,165.

The receptor surface for the image and non-image areas is preferably a textile such as a shirt (e.g., tee shirt) or the like. However, any receptor capable of receiving the imaging material (e.g. image and non-image areas) of the imaging sheet and imparting the desired wash-proof properties is within the scope of the invention.

Preferably, the transfer coating layer is located between the support and the photosensitive layer(s) or between the support and the developer material.

The imaging sheet comprises a suitable support or substrate which may be any type of known material ordinarily used as a support for imaging materials (e.g. paper, plastic coated papers, PET resins, etc.).

A transfer coating of a release material capable of holding developed image and non-image areas which can then be transferred to a receptor surface is coated on the support or substrate. The release materials provides a colorfast image when transferred to the receptor surface. Suitable release materials include but are not limited to Singapore Dammar resin (m.p. 115° C.), Batavia Dammar resin (m.p. 105° C.), accroide (yucca) resin (m.p. 130° C.), East India resins (m.p. 140°–174° C.), Kauri resins (m.p. 135° C.), Manila resins (m.p. 120°–130° C.), and pontianak (m.p. 135° C.). A preferable release material which is coated on the support is Singapore Dammar resin.

The release material may be coated on the support in any desired thickness by any suitable conventional coating technique (e.g., spin coating, rollers such as graveuer or rubber, spray or knife application). Preferably, the release material is in the range of about ¼ mil to 2 mil in thickness when dry, and more preferably, the thickness of the release coating is about 1 mil.

The release coating (e.g., Singapore Dammar resin) may be optionally coated on known transfer papers such as a transfer paper manufactured by Kimberly-Clark Corporation under the trademark "TRANSEEZE". Alternatively, the photosensitive materials may be directly coated onto known types of transfer papers having suitable properties as the coated supports of the present invention. Thus, "TRANSEEZE" per se may be suitable as a support and transfer coating layer for the present invention.

The support or substrate which is coated with the transfer coating (e.g., release coating) is subsequently coated with the desired photosensitive materials in a conventional manner by methods known to one of ordinary skill in the art.

The invention is illustrated in more detail by the following non-limiting examples:

EXAMPLE 1

Coating solutions formulation:

62.8% Photosensitive Microcapsule at 31.2% solids
18.8% HRJ4098 phenolic developer resin (Schnectady Chemical Co.) at 53.7% solids
3.0% Varion CAS surfactant at 10% solution
15.4% $H_2O$ to make 30% total solids The preparation of the photosensitive microcapsules is described in U.S. application Ser. No.: 755,400 filed Jul. 16, 1985.

The coating solution is then coated onto commercially available TRANSEEZE with a #12 coating rod and air gun dried.

The coated sheet is then image-wise exposed through a mask for 5.2 seconds using a fluorescent light source.

The exposed sheet is processed at high pressure with a calendaring roll as described in Example 1 of U.S. Pat. No. 4,751,165.

EXAMPLE 2

Referring to FIG. 2, the method of applying the image and non-image areas to a receptor element will be described.

The imaging sheet 50 is prepared, exposed and developed to form an image as in Example 1. A receptor element (e.g., tee shirt 62) is laid flat as illustrated, on an appropriate support surface, and the front surface of the imaging sheet 50 is positioned on the tee shirt. An iron 64 is run and pressed across the back 52A of the imaging sheet. The image and non-image areas are transferred to the tee-shirt and the support is removed and discarded.

EXAMPLE 3

Example 1 is repeated except that the photosensitive microcapsules are coated on a support having a 1 mil thick layer of Singapore Dammar resin thereon as the transfer layer.

EXAMPLE 4

Example 2 is repeated with the imaging sheet of Example 3.

EXAMPLE 5

Example 1 is repeated except that the photosensitive microcapsules are coated onto TRANSEEZE which is coated with a 1 mil thick layer of Singapore Dammar resin as the transfer layer.

EXAMPLE 6

Example 2 is repeated with the imaging sheet of Example 5.

EXAMPLE 7

Considering % solids and color balance requirements, photosensitive microcapsules with initiators responding to 350 nm, 390 nm, and 470 nm are blended together.

| Coating formulation: |
| --- |
| 59.4% capsule blend @ 33% solids |
| 18.8% HRJ4098 phenolic developer resin @ 53.7 solids |
| 3.0% Varion CAS @ 10% solution |
| 18.8% H₂O to make 30% solids coating solution |

For preparation of the microcapsules, reference can be made to U.S. application Ser. No. 755,400 filed Jul. 16, 1985.

The coating solution is coated onto TRANSEEZE which is coated with a 1 mil thick layer of Singapore Dammar resin as the transfer layer using a #12 coating rod and air gun to dry. The coated sheet is then imagewise exposed through color separation masks for 24,6 and 3 seconds at 350 nm, 390 nm, and 470 nm, respectively. A 1000 watt Xenon arc lamp is used with filters to modulate the wavelength.

The exposed sheet is processed at high pressure through a calendar roller as described in Example 2 of U.S. Pat. No. 4,751,165.

EXAMPLE 8

Example 2 is repeated with the imaging sheet of Example 7.

Accordingly, the present invention is directed to an imaging system (e.g. donor sheet or a self-contained single sheet system), which comprises a support having a front and rear surface, a transfer coating on said front surface of the support comprising a material capable of holding developed image and non-image areas that can be transferred to a receptor surface upon the application of heat to the rear surface of the support, said transfer coating layer capable of liquefying when heated and resolidifying when heat is removed, and a layer of microcapsules (e.g. color forming) on said transfer coating.

The transfer coating of the present invention is applicable to any imaging system based on photosensitive encapsulates. Thus, in an imaging system comprising (i) an imaging sheet and developer material carried on said imaging sheet, or (ii) an imaging sheet and a developer carried on a separate developer sheet, the imaging sheet having a layer of an encapsulated radiation curable photosensitive composition, said imaging system capable of forming images by image-wise exposing said imaging sheet to radiation actinic with respect to said photosensitive composition, and rupturing or otherwise dissolving capsules in the presence of said developer material to form an image, wherein the improvement comprises a transfer coating on the front surface of a support of the imaging sheet, developer sheet, or both comprising a material capable of holding developed image and non-image areas that can be transferred to a receptor surface upon the application of heat to the rear surface of the support, said transfer coating layer capable of liquefying when heated and resolidifying when heat is removed.

The present invention further relates to a developer sheet which comprises a support having a front and rear surface, a transfer coating on said front surface of the support comprising a material capable of holding developed image and non-image areas that can be transferred to a receptor surface upon the application of heat to the rear surface of the support, said transfer coating layer capable of liquefying when heated and resolidifying when heat is removed, and a developer material capable of reacting with a color forming substance to form an image.

Another embodiment of the present invention is directed to an imaging sheet useful in forming images onto a receptor surface, said sheet comprising: a support having a front and rear surface, a transfer coating on said front surface of the support comprising a material capable of holding image and non-image areas that can be transferred to a receptor surface upon the application of heat to the rear surface of the support, said transfer coating capable of liquefying when heated and resolidifying when heat is removed, a plurality of photosensitive microcapsules and a developer on the surface thereof, said microcapsules and said developer being present on the same layer or in contiguous layers on the surface of said support, said microcapsules containing a color former which is capable of reacting with said developer and forming a visible dye image, said imaging sheet being useful for transferring image and non-image areas onto a receptor surface. In this embodiment, the developer may be a thermoplastic developer-containing resin. Moreover, the microcapsules may contain an internal phase which includes a photosensitive composition which changes in viscosity in response to exposure to actinic radiation.

The present invention further relates of a method of transferring image and non-image areas to a receptor element, which comprises the steps of:

(a) exposing image-wise any of the imaging sheets of the invention having a front surface and a rear surface and optionally containing the transfer layer of the invention, (b) developing the image-wise exposed element to form an image, (c) positioning the front surface of the developed element or positioning the undeveloped element prior to development against a receptor element, said developed element or undeveloped element containing the transfer layer of the invention, and (d) applying heat to the rear surface of the developed or undeveloped element to transfer the developed image and non-image area to the receptor element.

The present invention is further directed to the photosensitive imaging system and self-contained imaging sheet of U.S. Pat. No. 4,440,846, which further comprises the transfer layer of the present invention.

More specifically, the present invention is directed to a photosensitive imaging system in which images are formed by image-wise reaction of one or more chromogenic materials and a developer, said system comprising:

a substrate having front and back surfaces, a transfer coating on said front surface of the support comprising a material capable of holding developed image and non-image areas that can be transferred to a receptor surface upon the application of heat to the rear surface of the support, said transfer coating layer capable of liquefying when heated and resolidifying when heat is removed, a chromogenic material, a radiation curable composition which undergoes an increase in viscosity upon exposure to actinic radiation, a coating containing said chromogenic material and said radiation curable composition on one of said front and back surfaces, and a developer material capable of reacting with said chromogenic material to form a visible image, said radiation curable composition being encapsulated in rupturable capsules as an internal phase, wherein images are formed by image-wise exposing said coating to actinic radiation and rupturing said capsules in the image areas such that said internal phase is released from said capsules in the image areas and said chromogenic material and said developer react pattern-wise to form an image. The internal phase may be encapsulated in a microcapsule having a discrete capsule wall. The chromogenic material may be encapsulated with said radiation curable composition.

The invention further relates to a self-contained imaging sheet in which images are formed by image-wise reaction of one or more chromogenic materials and a developer material, said sheet comprising:

a substrate having a front and back surface, a transfer coating on said front surface of the support comprising a material capable of holding developed image and non-image areas that can be transferred to a receptor surface upon the application of heat to the rear surface of the support, said transfer coating layer capable of liquefying when heated and resolidifying when heat is removed, a chromogenic material, a radiation curable composition which undergoes an increase in viscosity upon exposure to actinic radiation, a coating containing said chromogenic material and said radiation curable composition on one of said front and back surfaces, a developer material capable of reacting with said chromogenic material to form a visible image codeposited on said substrate with said coating containing said chromogenic material, said radiation curable composition being encapsulated in rupturable capsules as an internal phase, wherein images are formed by image-wise exposing said coated substrate to actinic radiation, and rupturing said capsules in the image areas such that said internal phase is released from said capsules in the image areas and said chromogenic material pattern-wise reacts with said developer material to form an image. The internal phase may be encapsulated in a microcapsule having a discrete capsule wall. The chromogenic material may be encapsulated with said radiation curable composition.

The present invention is also directed to the transfer imaging system of U.S. Pat. No. 4,399,209, which further comprises the transfer layer of the present invention. More specifically, the present invention is directed to a transfer imaging system in which images are formed by image-wise reaction of one or more chromogenic materials and a developer, said system comprising:

an imaging sheet comprising a first substrate, a radiation curable composition which undergoes an increase in viscosity upon exposure to actinic radiation, a coating on one surface of said first substrate comprising said chromogenic material and said radiation curable composition, said radiation curable composition being encapsulated in rupturable capsules as an internal phase, and a developer sheet comprising a second substrate having a front and rear surface, a transfer coating on said front surface of the second substrate comprising a material capable of holding developed image and non-image areas that can be transferred to a receptor surface upon the application of heat to the rear surface of the support, said transfer coating layer capable of liquefying when heated and resolidifying when heat is removed, a developer material on said transfer coating capable of reacting with said chromogenic material to form an image on the surface of said second substrate, wherein images are formed by image-wise exposing said coating to actinic radiation, and rupturing capsules in the image areas with said coating in facial contact with said developer sheet such that said internal phase is image-wise released from said ruptured capsules and there is image-wise transfer of said chromogenic material to said developer sheet and a patterned image-forming reaction occurs between said chromogenic material and said developer material. The capsule may be a microcapsule having a discrete capsule wall. The chromogenic material may be encapsulated with said radiation curable composition.

Moreover, the invention is directed to the transfer imaging system of U.S. Pat. No. 4,551,407 which further comprises the transfer layer of the present invention. Thus, the present invention relates to a transfer imaging system in which images are formed by image-wise reaction of one or more chromogenic materials and a developer, said system comprising:

an imaging sheet comprising a first substrate, a chromogenic material, a photodepolymerizable composition which undergoes a decrease in viscosity upon exposure to actinic radiation, a coating on one surface of said first substrate comprising said chromogenic material and said photodepolymerizable composition, said photodepolymerizable composition being encapsulated in rupturable capsules as an internal phase, and a developer sheet comprising a second substrate having a front and rear surface, a transfer coating on said front surface of the second substrate comprising a material capable of holding developed image and non-image areas that can be transferred to a receptor surface upon the application of heat to the rear surface of the support, said transfer coating layer capable of liquefying when heated and resolidifying when heat is removed, a developer material on said transfer coating capable of reacting with said chromogenic material to form an image on the surface of said second substrate, wherein images are formed by image-wise exposing said coating to actinic radiation, and rupturing said capsules in the exposed areas with said coating in facial contact with said developer sheet such that said internal phase is image-wise released from said ruptured capsules and there is image-wise transfer of said chromogenic material to said developer sheet and a patterned image-forming reaction occurs between said chromogenic material and said developer material. The capsule may be a microcapsule having a discrete capsule wall. The chromogenic material may be encapsulated with said photodepolymerizable composition.

In addition, the present invention relates to the photosensitive imaging system and self-contained imaging sheet of U.S. Pat. No. 4,536,463, which further comprises the transfer layer of the present invention. Thus, the present invention relates to a photosensitive imaging system (or, self-contained sheet) in which images are formed by image-wise reaction of one or more chromogenic materials and a developer, said system (or sheet) comprising a substrate having front and back surfaces, a transfer coating on said front surface of the support comprising a material capable of holding developed image and non-image areas that can be transferred to a receptor surface upon the application of heat to the rear surface of the support, said transfer coating layer capable of liquefying when heated and resolidifying when heat is removed, a chromogenic material, a composition which undergoes a decrease in viscosity upon exposure to actinic radiation, a coating containing said chromogenic material and said composition on one of said front and back surfaces, and developer material capable of reacting with said chromogenic material to form a visible image, said composition being encapsulated in rupturable capsules as an internal phase, wherein images are formed by image-wise exposing said coating to actinic radiation and rupturing said capsules in the exposed areas and said chromogenic material and said developer react pattern-wise to form an image. The internal phase may be encapsulated in a microcapsule having a discrete capsule wall. The chromogenic material may be encapsulated with said photosensitive composition.

The invention is further directed to the imaging sheet of U.S. Pat. No. 4,822,714, which further comprises the transfer layer of the present invention. Accordingly, the present invention is directed to an imaging sheet useful in forming images by exposure-controlled, image-wise reaction of a chromogenic material and a developer, said sheet comprising:

a support having a front and rear surface, a transfer coating on said front surface of the support comprising a material capable of holding developed image and non-image areas that can be transferred to a receptor surface upon the application of heat to the rear surface of the support, said transfer coating layer capable of liquefying when heated and resolidifying when heat is removed, a layer of microcapsules on said transfer coating, said microcapsules having discrete capsule walls which encapsulate an internal phase, said internal phase, including a photosensitive composition which undergoes a change in viscosity sufficient to control the release of the internal phase from said microcapsule, a chromogenic material associated with said microcapsule such that, upon image-wise exposing said layer of microcapsules to actinic radiation and subjecting said layer of microcapsules to a uniform rupturing force, said chromogenic material image-wise becomes available for reaction with a developer to form an image.

Furthermore, the invention is directed to the imaging system of U.S. Pat. No. 4,416,966 which further comprises the transfer layer of the present invention. Thus, the present invention is directed to an imaging system comprising:

an imaging sheet and a background dye or a combination of a dye precursor and a dye developer which react to form a background dye, said imaging sheet including:

a support having a front and rear surface, a transfer coating on said front surface support comprising a material capable of holding developed image and non-image areas that can be transferred to a receptor surface upon the application of heat to the rear surface of the support, said transfer coating layer capable of liquefying when heated and resolidifying when heat is removed, a plurality of capsules in a layer on one surface of said support, and an internal phase contained within said capsules comprising a decolorizing agent and a photohardenable or photosoftenable radiation sensitive composition, wherein images can be formed by image-wise exposing said sheet to actinic radiation and rupturing said capsules such that said decolorizing agent is image-wise released from said capsules and reacts with said associated background dye to decolorize it or inhibits, prevents or reverses the color forming reaction of said dye precursor and dye developer to produce a color difference in the form of an image.

The invention is further directed to the imaging material of U.S. Pat. No. 4,788,125 which further comprises the transfer layer of the present invention.

The term "microparticle" is used herein to define a particle formed from an admixture of an image-forming agent and a photosensitive composition containing a depolymerizable polymer. The term "microparticle" is to be distinguished from the term "microcapsule" which is defined in U.S. Pat. Nos. 4,399,209 and 4,440,846 as a capsule having a discrete capsule wall or an encapsulated dispersion of a photosensitive composition in a binder.

Thus, the present invention is directed to an imaging material comprising a support having a front and rear surface, a transfer coating on said front surface support comprising a material capable of holding developed image and non-image areas that can be transferred to a receptor surface upon the application of heat to the rear surface of the support, said transfer coating layer capable of liquefying when heated and resolidifying when heat is removed, and a layer of photosensitive microparticles on one surface of said support, said microparticles including an image-forming agent and a photosensitive composition containing a polymer which is capable of undergoing cationically-initiated depolymerization and a photoinitiator including a silver halide and an organo silver salt, wherein, after exposing said microparticle to radiation, said microparticles, directly or with additional processing, release said image-forming agent or become permeable to a developer which reacts with said image-forming agent to form a visible image.

The microparticles may comprise a first set of microparticles containing a cyan image-forming material having a first wavelength sensitivity, a second set of microparticles containing a magenta image-forming material having a second wavelength sensitivity, and a third set of microparticles containing a yellow image-forming material having a third wavelength sensitivity, said first, second, and third sensitivities being sufficiently different that upon exposing said imaging material to a first radiation, substantially only said first microparticles release said image-forming material, upon exposing said imaging material to a second radiation different than said first radiation, substantially only said second set of microparticles release said image-forming material, and upon exposing said imaging material to a third radiation different than said first and second radiations, substantially only said third set of microparticles release said image-forming material.

The image-forming agent may be a colored dye or pigment.

The image-forming agent may be a chromogenic material and a developer material associated with said imaging material may be capable of reacting with said chromogenic material and forming a visible image.

The first, second, and third radiation may be respectively red, green and blue light.

Also, the present invention is directed to the color imaging system of U.S. Pat. No. 4,842,976 which further comprises the transfer coating of the present invention. Thus, the present invention is directed to a color imaging system comprising:

an imaging sheet having a front and rear surface, a transfer coating on said front surface of the imaging sheet comprising a material capable of holding developed image and non-image areas that can be transferred to a receptor surface upon the application of heat to the rear surface of the imaging sheet, said transfer coating layer capable of liquefying when heated and resolidifying when heat is removed, and dry developer material carried on said imaging sheet, or an imaging sheet, a separate image receiving developer sheet having a front and rear surface and having said transfer coating and a dry developer material on said front surface, said imaging sheet having on the front surface thereof a coating comprising a cyan color precursor, a radiation curable photosensitive composition associated with said cyan color precursor, a magenta color precursor, a radiation curable photosensitive composition associated with said magenta color precursor, a yellow color precursor, and a radiation curable photosensitive composition associated with said yellow color precursor, said radiation curable photosensitive compositions having distinct sensitivities and being encapsulated in pressure rupturable capsules as an internal phase, said capsules having discrete capsule walls, said cyan, magenta and yellow color precursors being soluble in said associated photosensitive compositions or solvents for said color precursors being encapsulated with said associated photosensitive compositions and said color precursors being present in said capsules with said photosensitive compositions or in said discrete walls;

said imaging system being capable of forming images by image-wise exposing said imaging sheet to radiation actinic with respect to said photosensitive compositions, and rupturing at least said capsules containing photosensitive compositions unexposed by said actinic radiation in the presence of said developer material to form an image by reaction of said color precursors with said developer material.

The cyan, magenta and yellow color precursors may be encapsulated in pressure rupturable capsules with their associated radiation curable photosensitive compositions.

All publications, including U.S. Patents, as well as all U.S. Patent applications referred to in this application are herein incorporated by reference.

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What I claim is:

1. A developer sheet, which comprises:
   a support having a front and rear surface,
   a transfer coating on said front surface of the support comprising a material capable of holding developed image and non-image areas that can be transferred to a receptor surface upon the application of heat to the rear surface of the support, said transfer coating layer capable of stripping 2. The developer sheet of claim 1, wherein the developer is a thermoplastic developer-container resin.

3. The developer sheet of claim 1, wherein the transfer coating layer comprises Singapore Dammar resin.

4. The developer sheet of claim 1, wherein the support and transfer coating layer are combined to form a heat transfer product known as TRANSEEZE.

5. The developer sheet of claim 4, wherein the transfer product further comprises Singapore Dammar resin.

* * * * *

UNITED STATES PATENT AND TRADEMARK OFFICE
CERTIFICATE OF CORRECTION

PATENT NO. : 5,236,801
DATED : Aug. 17, 1993
INVENTOR(S) : Donald Hare It is certified that error appears in the above-identified patent and that said Letters Patent is hereby corrected as shown below:

Column 14, line 34 (Claim 1), after "stripping" insert --from said front surface of the support and adhering to said receptor surface by liquefying and releasing from said support when heated, and resolidifying within and around fibers of said receptor surface when heat is removed, said resolidified liquid coating seals the transferred image and non-image areas to the receptor surface rendering the transferred image washproof or wash resistant, and
    a developer material capable of reacting with a color forming substance.--

Signed and Sealed this

Third Day of May, 1994

Attest:

BRUCE LEHMAN

Attesting Officer     Commissioner of Patents and Trademarks